United States Patent [19]
Cota et al.

[11] Patent Number: 5,082,505
[45] Date of Patent: Jan. 21, 1992

[54] SELF-SUSTAINING POWER MODULE

[76] Inventors: Albert O. Cota, 17475 Flanders St., Granada Hills, Calif. 91344; John J. Reed, 5052 Meadow Wood Ave., Lakewood, Calif. 90712

[21] Appl. No.: 474,737
[22] PCT Filed: Dec. 29, 1988
[86] PCT No.: PCT/US88/04704
§ 371 Date: May 8, 1989
§ 102(e) Date: May 8, 1989
[87] PCT Pub. No.: WO90/07797
PCT Pub. Date: Jul. 12, 1990
[51] Int. Cl.$^5$ .............. H01L 31/06; H01L 31/04; H02N 6/00
[52] U.S. Cl. .............. 136/253; 136/244; 136/293; 310/303
[58] Field of Search .............. 136/253, 244, 291, 293; 310/303

[56] References Cited
U.S. PATENT DOCUMENTS

| | | | |
|---|---|---|---|
| 3,031,519 | 4/1962 | Silverman | 136/253 |
| 4,242,147 | 12/1980 | DeToia | 136/253 |
| 4,392,006 | 7/1983 | Apelian | 136/246 |

FOREIGN PATENT DOCUMENTS

| | | | |
|---|---|---|---|
| 615938 | 3/1961 | Canada | 136/253 |
| 638106 | 5/1950 | United Kingdom | 136/253 |

Primary Examiner—Aaron Weisstuch
Attorney, Agent, or Firm—Albert O. Cota

[57] ABSTRACT

A self-sustaining power module (10) that combines the technologies of radioactivity with photovoltaic cells (12) to produce an electrical power supply having a useful life of over ten years. The radioactive source is a tritium capsule (22) that interfaces with the receptor surface of the photovoltaic cell (12). The capsule (22) has inside surfaces that are coated with a phosphor and is filled with tritium gas (26). The tritium gas produces beta particles that bombard the phosphor (18) causing the phosphor to luminesce and produce photons. The photons, in turn, strike and cause the photovoltaic cell (12) to generate a current flow that is then applied, via a pair of electrtodes (30), (32), to an external load. Also disclosed is a power pack (40) that houses a plurality of power modules (10). The power pack includes provisions that allow the power modules (10) to be electrically interconnected to provide various series, parallel and series-parallel power output combinations.

4 Claims, 4 Drawing Sheets

SELF-SUSTAINING POWER MODULE

TECHNICAL FIELD

The invention pertains to the general field of electrical/electronic power sources and more particularly to a power module that incorporates a radioactive source, such as tritium, with a photovoltaic cell to produce a self-sustaining power source having a useful life of over ten years.

BACKGROUND ART

Since the advent of electrical apparatuses, and more importantly since the advent of electronic systems for military and aerospace applications, there has been a quest for finding a reliable and low-maintenance power source.

In the state-of-the-art, various types of power sources are in use today, including: wet and dry batteries which consist of groupings of cells which are further divided into non-rechargeable primary cells and rechargeable secondary cells; fuel cells that operate by continuously changing the chemical energy of a fuel and an oxidant to electrical energy; highly regulated electronic power supplies; and photovoltaic cells (often called solar cells) that are semiconductor devices which are capable of converting a light source, such as sunlight, directly into electricity. With photovoltaic cells, the energy in the light source is transferred to electrons in a semiconductor material. This occurs when photons strike the semiconductor material with enough energy to dislodge electrons from a fixed position in the material's valence band into the material's conduction band. A vacant electron position or "hole" is left behind at the site of the collision. Such holes can move if a neighboring electron leaves its site to fill the former hole site. An electrical current is created if these pairs of electrons and holes are separated by an intrinsic voltage in the cell material The most common technique for producing such a voltage is to create an abrupt discontinuity in the conductivity of the cell material by adding small amounts of impurities or dopants to the pure material In all of the above power sources, there is a requirement that one or more of the active elements be periodically replenished or replaced In batteries, the dry cell is either discarded after its useful life or with nickel-cadmium cells and the like, or secondary cells, they may be recharged by an external power source. Electronic power supplies require that they be operated by an external power source. To operate fuel cells, they must use a gas i.e., oxygen or air plus bottled hydrogen. To recharge a fuel cell, the emptied tank of. hydrogen is replaced with a new one. Photovoltaic cells require no type of replenishment However, a non-constant light source, such as sunlight or an electrically powered light, is required to allow the photovoltaic cell to produce electrical power. The instant invention requires no external power source to operate nor any replenishment or replacement of elements A search of the prior art, that included a literature search and a patent search did not disclose any articles or patents that read directly on the claims of the instand invention; however, the following U.S. patents were considered related:

| U.S. PAT. NO. | INVENTOR | ISSUED |
| --- | --- | --- |
| 4,629,821 | Bronstein-Bonte | 16 December 1986 |
| 4,190,465 | Boling | 26 February 1980 |
| 4,155,371 | Wohlmut | 22 May 1979 |
| 4,140,544 | Sill | 20 February 1979 |
| 2,259,372 | Geisler | 14 October 1941 |

The Bonstein-Bonte patent discloses a photovoltaic cell (PVC) that incorporates luminescent materials. These materials absorb radiation at the lower wavelength end of the spectrum, which cannot be utilized by the PVC, but which then emit light at a longer wavelength. The PVC is responsive to these longer wavelength and thus converts the light to electrical energy.

The Boling patent discloses a solar activated luminescent solar collector structure. The structure has a light conducting medium that is physically and optically coupled on its upper surface to a thin light conducting luminescent layer. On the medium's lower surface is physically and optically coupled a photovoltaic cell (PVC). An optical mirror may be located below the PVC to reflect any escaping light that would otherwise activate the luminescent layer. In operation, light strikes the luminescent layer which has a lower index of refraction than the light conducting medium. The sunlight actives the luminescent layer and the subsequent emitted radiation is applied to the light conducting medium and on to activate the PVC.

The Wohlmut patent discloses a luminescent solar collector which employs a plurality of different types of photovoltaic cells (PVC). The luminescent solar collector has a luminescent member with a least two types of PVC's. Each type of PVC operates efficiently for the generation of electricity over a wavelength range which is different from the efficient wavelength range of the other types of PVC's present on the luminescent member. Each type of PVC also carries intermediate to it and the luminescent member a filter means which allows only light within the efficient wavelength range for that type of PVC to pass from the luminescent member into the PVC.

The Sill patent discloses a luminescent photovoltaic cell (PVC) device for converting solar or other high-level light radiation to electrical energy. The device includes a luminescent collector member having divergent upper and lower surfaces. These surfaces are divergent in at least that part or area of the collector where solar radiation enters the collector. The direction of divergence is selected to direct the internal surface angle of the reflection of collected light energy toward one or more PVC's mounted on or coupled to one or more edge surfaces of the collector.

The Geisler patent discloses a light sensitive device that is sensitive to high-level x-rays and other short-wave length radiations. The device consists of a base plate preferably of aluminum. On the plates upper surface is a selenium layer that is covered with a light permeable counter electrode which, in turn, is covered with a fluorescent substance capable of being excited by the x-ray radiations. A photovoltaic cell (PVC) is positioned relative to the source of radiation. In operation, the rays passing through the device impinge upon the fluorescent substance which is then rendered luminous. The visible rays diffused from the fluorescent substance penetrate into the PVC where electrons are released that results in a current flow.

DISCLOSURE OF THE INVENTION

The self-sustaining power module combines the technologies of radioactivity and photovoltaic cells to produce an electrical power supply that requires no external stimuli to maintain a constant power output.

The radioactivity that energizes the power module consists of a self-sustaining photon-generating means that preferably is tritium. The tritium may be provided in either a tritium and phosphor mixture or as a tritium capsule. The capsule consists of a glass enclosure having a phosphor, such as zinc sulfide, deposited to its inner surfaces. A tritium gas is then inserted and hermetically sealed within the glass enclosure. The photovoltaic cells may be made of either crystalline or amorphous silicon or preferably, because of its sensitivity to photons, of gallium arsenide or the like.

The simplest and most basic configuration of the power module is a two-element structure where the receptor surface of a photovoltaic cell interfaces with one of the tritium sources. In all cases, the tritium constantly produces beta particles that bombard the phosphor, causing the phosphor to luminesce and produce photons The photons, in turn, strike and cause the photovoltaic cell to generate a current flow that is applied through a pair of electrodes to an external load.

Tritium has a half-life of over twelve years; photovoltaic cells also have an intrinsic high reliability. Therefore, the useful life of the power module is predicted to be in excess of ten years.

From the simplest basic configurations, two additional "basic" configurations can be expanded. In one such expansion, the tritium mixture or tritium capsule have a first and a second photon generating surface. Attached to each of these surfaces is a photovoltaic cell. In the second "basic" configuration, a back-to-back photovoltaic cell having two interfacing cells is used. In this configuration the composite cell has a receptor surface available on each of its two opposing surfaces. Attached to each of these receptor surfaces is the tritium source. In both cases, the two photovoltaic cells are electrically interconnected, in series or in parallel, and their output is attached by leads to a pair of electrodes to which the external load is connected.

Further expansions of the "basic" configurations include a design where a plurality of power modules are sequentially stacked and electrically connected. In one of these designs three back-to-back photovoltaic cells are used in combination with four tritium sources. In another design, two back-to-back photovoltaic cells and two single photovoltaic cells are combined with three tritium sources. These sequential stacks allow the photovoltaic cells to be electrically connected in various series, parallel and series-parallel combinations to provide outputs selected for specific voltage and current requirements.

The power module may be used individually or a plurality of power modules may be housed within a power pack. The power pack, which can be designed to accommodate as many power modules as are required for a specific application, includes a front and back panel. From these panels, the power modules can be electrically connected in a series, parallel or series-parallel combination to satisfy various voltage and current power requirements. Additionally, the power pack's d-c power output can be amplified or its output can be applied to an inverter for conversion to an a-c voltage.

The power pack, in either case, also provides the power to operate the amplifiers and the inverter.

In view of the above disclosure, it is the primary object of the invention to have a self-sustained power module that requires no external power or other stimuli to maintain a constant power output. In addition, it is also an object of the invention to produce a power module that:

○ has unlimited use capability from serving as the primary power source for a vehicle to powering an implanted heart-pulse device;

○ can be designed to provide various combinations of voltages and currents,

○ is cost-effective in terms of design and manufacturing,

○ requires minimal protective shielding,

○ produces no, and is impervious to, electromagnetic interference (EMI),

○ is highly reliable in terms of Mean-Time-Between-Failure (MTBF) and useful life, ○ requires no preventive maintenance, and ○ has an excellent size/weight to power ratio.

These and other objects and advantages of the present invention will become apparent from the subsequent detailed description of the preferred embodiment and the appended claims taken in conjunction with the accompanying drawings.

BEST MODE FOR CARRYING OUT THE INVENTION

The best mode for carrying out the self-sustaining power module 10 is presented in terms of three basic embodiments and their subsequent variations. In all cases, the power module is designed to provide a self-sustained power source: that is, a power source that requires no external power or other stimuli to produce power and that virtually is perpetual in that its useful life is predicted to exceed ten years. The power module is comprised of two major elements, a photovoltaic cell 12 and a radioactive substance and phosphor mixture 14.

Figure 1:
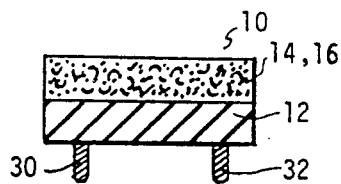
FIG. 1 is a cross-section of a power module with a mixture of a radioactive substance, such as tritium and phosphor attached to the receptor surface of a photovoltaic cell.
Figure 2:
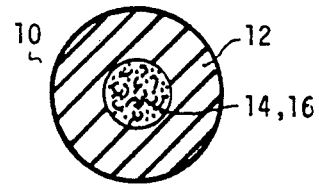
FIG. 2 is a cross-section of a circular power module having a mixture of a radioactive substance, such as tritium and phosphor, surrounded by a circular photovoltaic cell.

The basic first embodiment of the self-sustaining power module is shown in FIG. 1. In this design, a photovoltaic cell 12 is used in combination with a self-sustaining photon-generating means that is attached to the receptor surface of the photovoltaic cell 12. The photons bombard and cause the photovoltaic cell to generate an electrical current flow. Attached to the photovoltaic cell are a pair of output electrodes from which the output is applied to an external load.

In the first embodiment, as well as in all the other deviations of the first embodiment as shown in FIGS. 2-5 and 8, the self-sustaining photon-generating means is a mixture 14 consisting of a radioactive substance and a phosphor that is deposited on the receptor surface of the photovoltaic cell 12. The mixture 14 is self-sustaining and emits photons of sufficient energy to cause a current flow in the photovoltaic cell 12.

Figure 11:
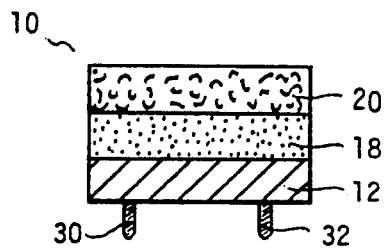
FIG. 11 is a cross-section of a power module with a layer of solid tritium over a phosphor layer that is attached to the receptor surface of a photovoltaic cell.

In the second embodiment, as shown in FIG. 11, the self-sustaining photon-generating means, consists of a deposited phosphor 18 on the receptor surface of the photovoltaic cell 12. On the phosphor 18 surface is then subsequently deposited a radioactive substance that is self-sustaining and causes photons to be produced by the phosphor 18 of sufficient energy to generate a current flow in the photovoltaic cell 12.

In both the first and second embodiment, the radioactive substance may be tritium and the phosphor may be zinc sulfide. Tritium is a hydrogen isotope of mass number 3, having two neutrons and a proton in its nucleus. It is radioactive, having a half-life of 12.4 years and decays with an emission of a beta particle. Such a decay is represented by the nuclear equation:

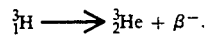

$$^{3}_{1}H \longrightarrow {}^{3}_{2}He + \beta^{-}.$$

The tritium is utilized in the power module 10 in three distinct forms: the first, as is used in the first embodiment, is a commercially available preparation consisting of a tritiated compound that is mixed with a phosphor such as zinc sulfide; the second, as is used in the second embodiment, is also a commercially available preparation consisting solely of a tritiated compound. Both of the tritiated compounds form a paste that after application, maintains its shape to provide an excellent photon transferring interface. The tritiated compounds are manufactured and sold by M-B Microtech and Radium-Chemie both of Switzerland.

Figure 12:
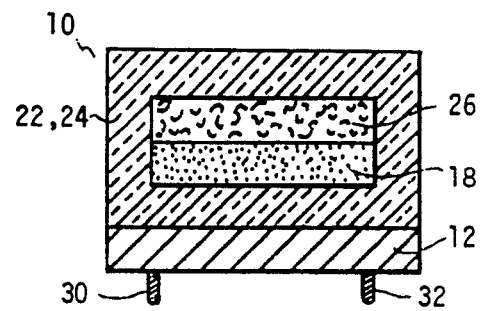
FIG. 12 is a cross-section of a power module with a tritium capsule, consisting of a hermetic glass enclosure enclosing a coating of phosphor and a tritium gas, attached to the receptor surface of a photovoltaic cell.

The third self-sustaining photon-generating means, as shown in FIG. 12, is comprised of a tritium capsule 22 that is attached to the receptor surface of the photovoltaic cell 12. The capsule 22 consists of a hermetic glass enclosure 24 that has a phosphor 18, such as zinc sulfide, deposited to its inside surface. A quantity of tritium gas 26 is then inserted into and hermetically sealed in the glass enclosure 24. The tritium capsule 22 is also self-sustaining and produces photons of sufficient energy to generate a current flow in the photovoltaic cell 12.

The photovoltaic cell 12 is also common to all embodiments. The cell may be made of single-crystal silicon, amorphous silicon, gallium arsenide or like material. The gallium arsenide cell is preferred because of its greater sensitivity to the bombardment of the photons from the radioactive substance and the phosphor mixture 14.

As shown in the figures, the preferred configuration of the power module is in a rectangular shape. However, as shown, typically in FIG. 2, the module may be made in a circular or other shape such as an octagon (not shown). The fundamental requirement for any shape is that an optimum transfer interface be made between the photon-generating means and the receptor surface of the photovoltaic cell 12.

The following paragraphs next describe the various configurations of the power module 10 that may be constructed from the basic embodiments.

Figure 3:
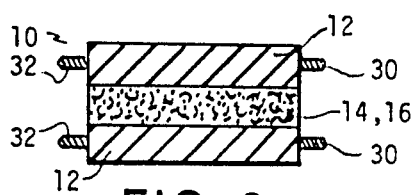
FIG. 3 is a cross-section of a power module having a mixture of a radioactive substance such as tritium and phosphor laminated between two photovoltaic cells.

In FIG. 3 is shown a power module 10 with a self-sustaining photon generating means 14, 16 having a first and a second photon generating surface that is laminated between a pair of photovoltaic cells 12. The first photovoltaic cell 12 has its receptor surface attached to the first photon generating surface of the photon generating means and the second cell has its receptor attached to the second photon generating surface. In this design, the output leads 30,32 may be interconnected in series or parallel configurations culminating in a pair of output electrodes to which an external load is connected.

Figure 4:
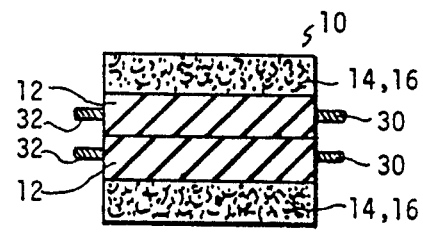
FIG. 4 is a cross-section of a power module having a back-to-back photovoltaic cell laminated between a mixture of a radioactive substance such as tritium and a phosphor.

The power module 10, shown in FIG. 4 utilizes a back-to-back photovoltaic cell that consists of two interfacing cells that have a receptor surface on the two opposing surfaces. Attached to each of the receptor surfaces is a self-sustaining photon-generating means. Each receptor is then electrically connected, either in series or in parallel and a pair of output leads are provided from which an external lead is attached.

Figure 5:
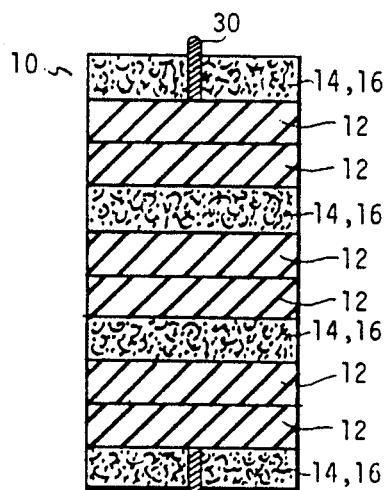
FIG. 5 is a cross-section of a power module consisting of a multiple laminated structure having successive layers of back-to-back photovoltaic cells and a radioactive source such as a tritium and phosphor mixture.
Figure 6:
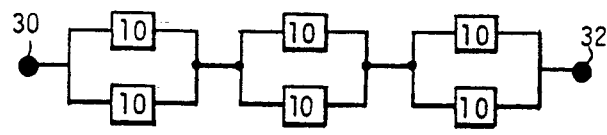
FIG. 6 is a schematic diagram of the multiple laminated structure shown in FIG. 5, electrically connected in a combination series-parallel configuration.
Figure 7:
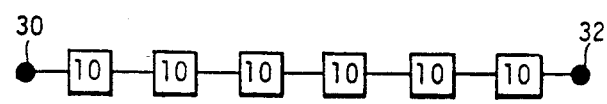
FIG. 7 is a schematic diagram of the multiple laminated structure shown in FIG. 5 electrically connected in a series configuration.
Figure 13:
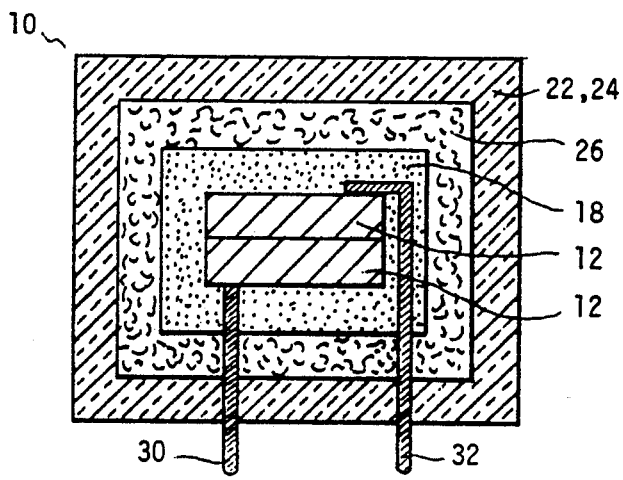
FIG. 13 is a cross-section of a power module having a back-to-back photovoltaic cell hermetically encased within a tritium capsule.

A derivation of the FIG. 3 and FIG. 4 power module is used to construct the power module shown in FIG. 5. In this configuration, a plurality of the power modules are sequentially stacked and electrically connected. Specifically, in the configuration shown in FIG. 5, three back-to-back photovoltaic cells are used in combination with four mixtures 14 of a radioactive substance and phosphor. Alternatively, a sequential stack may also be made by depositing the receptor surfaces of a back-to-back photovoltaic cell with a phosphor and enclosing the prepared cell in a hermetic capsule having a quantity of tritium gas as shown in FIG. 13. The electrical connections available for the FIG. 5 sequential power module are shown in FIGS. 6 and 7. In FIG. 6, the module is shown electrically connected in a series-parallel combination while in FIG. 7 it is shown connected in series.

Figure 8:
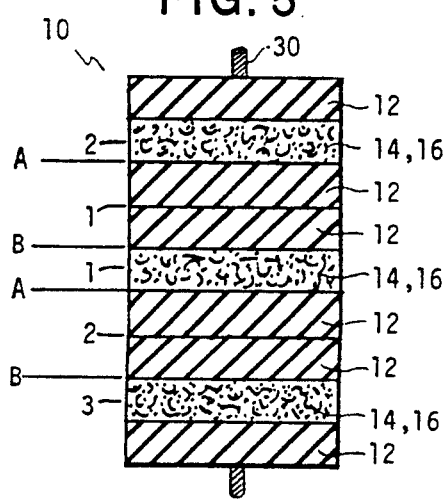
FIG. 8 is a cross-section of a power module consisting of another multiple laminated structure having successive layers of back-to-back photovoltaic cells and a radioactive source such as tritium and phosphor mixture.

The preferred sequential stack configuration of the power module 10 is shown in FIG. 8. This configuration is comprised of a first and second back-to-back photovoltaic cell where each cell 12 has a side "A" and side "B" receptor. A first radioactive substance 14, 16 composed of a mixture of tritium and phosphor, is deposited to the side "B" receptor of the first back-to-back photovoltaic cell and to the side "A" receptor of the second back-to-back photovoltaic cell. Also included in this sequential stack is a first and second single photovoltaic cell where each cell has a single receptor surface. A second tritium and phosphor mixture is deposited to the side "B" receptor of the first back-to-back photovoltaic cell and to the single receptor surface of the first single photovoltaic cell. A third tritium and phosphor mixture is subsequently deposited to the side "B" receptor of the second back-to-back photovoltaic cell and to the single receptor surface of the second single photovoltaic cell.

To complete the stack, an electrical connection is made between each of the back-to-back photovoltaic cells. The first back-to-back cell and the first single photovoltaic cell are then connected followed by a connection between the second back-to-back cell and the second single photovoltaic cell. An electrode 30,32 is then connected to the first and second single photovoltaic cells respectively from which an external load is connected.

Figure 9:
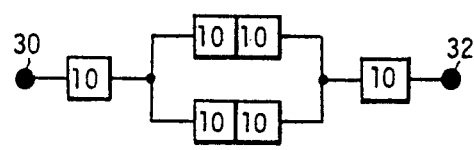
FIG. 9 is a schematic diagram of the multiple laminated structure shown in FIG. 8, electrically connected in a combination series-parallel configuration.
Figure 10:
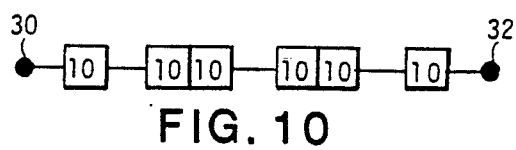
FIG. 10 is a schematic diagram of the multiple laminated structure shown in FIG. 8 electrically connected in a series configuration

Two of the electrical connections available for the FIG. 8 sequential power module 10 are shown in FIGS. 9 and 10. In FIG. 9, the module is shown electrically connected in a series-parallel combination; while in FIG. 10 it is shown connected in series.

Figure 14:
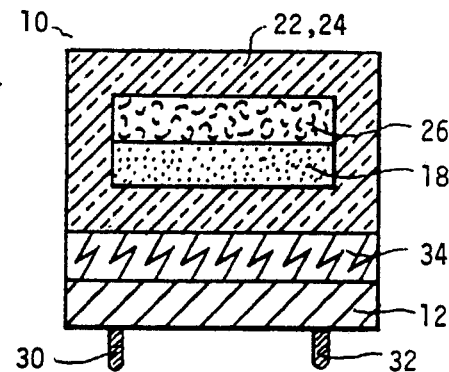
FIG. 14 is a cross-section of a power module having a frequency enhancer laminated between a tritium capsule and a photovoltaic cell.

The basic embodiments described supra may be modified as follows: as shown in FIG. 14, a frequency enhancing means 34 may be laminated between the photovoltaic cell 12 and the self-sustaining photon generating means 14, 16. The enhancing means 34 is selected to produce a photon frequency that best suits the material or type of photovoltaic cell being used.

Figure 15:
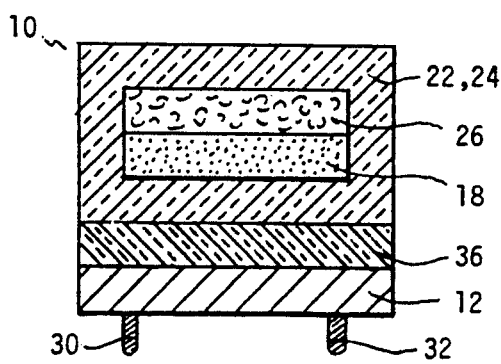
FIG. 15 is a cross-section of a power module having a concentrator/focusing lens laminated between a tritium capsule and a photovoltaic cell.

In FIG. 15, a concentrator/focusing lens 36 is laminated between the photovoltaic cell 12 and the self-sustaining photon-generating means 14, 16. This lens concentrates and focuses the light emitted by the photons to provide a light of greater intensity and efficiency. The lens may be made with a texturized surface that includes a multiplicity of lenses.

The frequency enhancing means 34 and the concentrator/focusing lens 36 may be sequentially stacked and laminated in certain cases to provide an optimum photon transfer efficiency.

Figure 16:
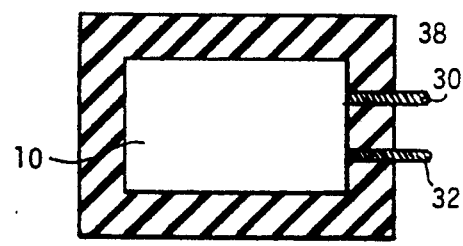
FIG. 16 is a cross-section of a power module encased within a resilient sleeve.

Additionally, as shown in FIG. 16, the power module may be encased in a resilient sleeve 38. The sleeve provides impact/shock protection and allows the power module 10 to be safely handled and transported.

The final element described is a power pack 40 that is designed to hold one or more power modules 10 to provide various combinations of voltages and currents.

Figure 17:
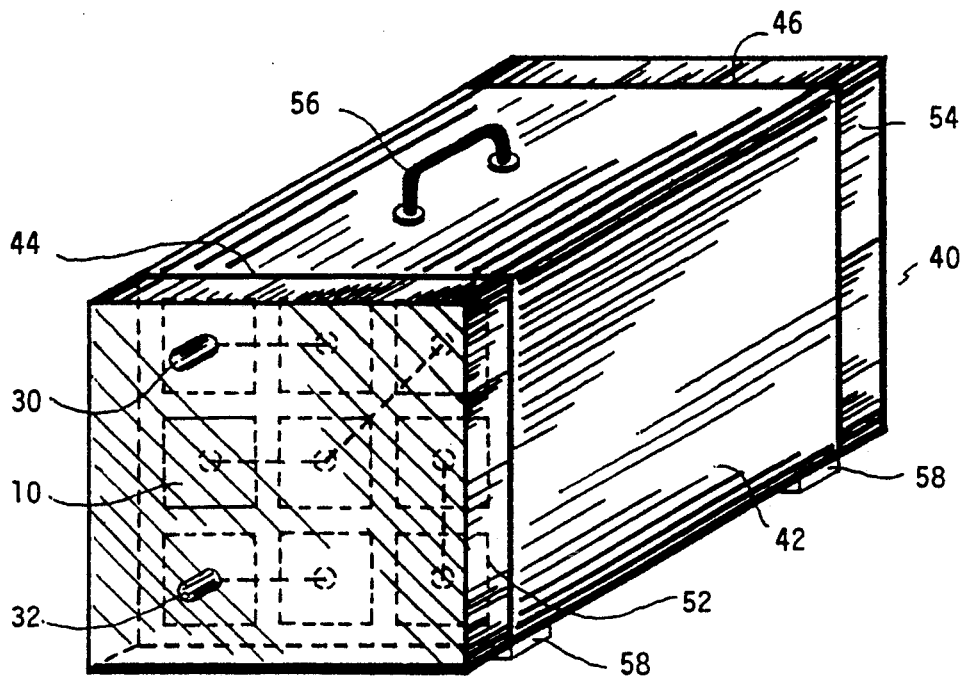
FIG. 17 is a perspective view of a power pack having a plurality of power pack cavities into which are inserted power modules that are connected to provide various voltage and current combinations.
Figure 21:
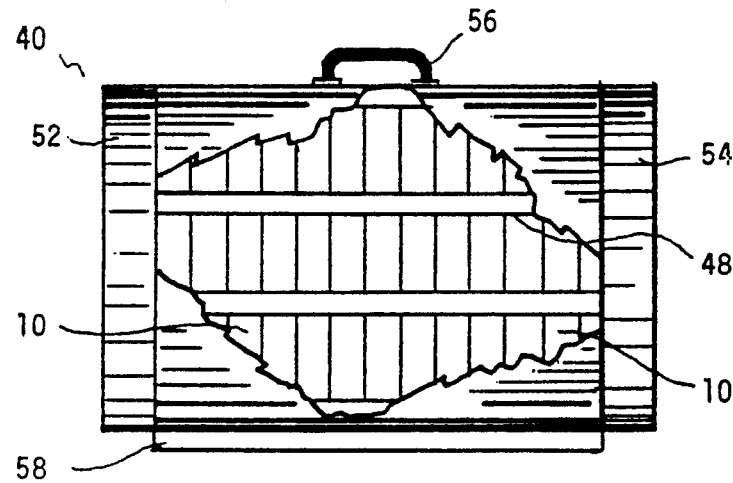
FIG. 21 is a partial cutaway side view of the power pack showing the placement of the power modules.

The power pack, as shown in FIGS. 17 and 21, is comprised of an enclosed housing 42 having a front panel 44 and a back panel 46. A plurality of power module cavities 48 are longitudinally located as shown best in FIG. 21. Each cavity is sized to slideably receive a power module 10. The power pack also includes a removable front cover 52 and a removable back cover 54. The respective covers expose the front panel and back panel from where the power modules may be electrically connected in a series, parallel or series-parallel combination.

Figure 18:
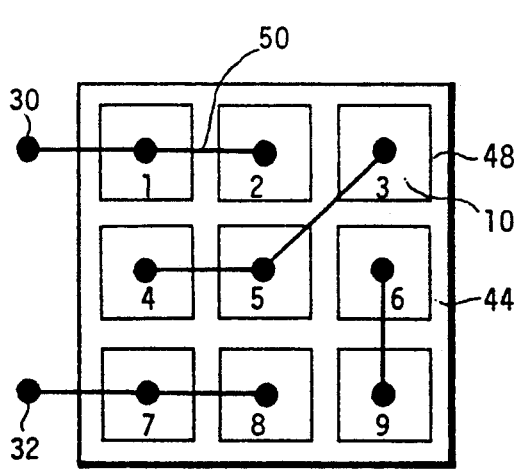
FIG. 18 is a plan view of the power packs front panel showing one side of the various power pack's electrical connections as seen from the front panel.
Figure 19:
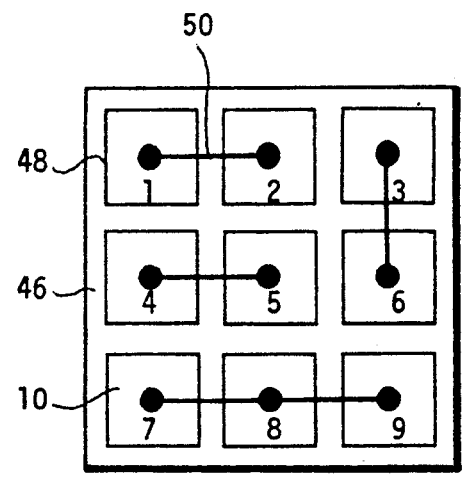
FIG. 19 is a plan view of the power packs back panel showing the other side of the electrical connections shown in FIG. 18 as seen from the back panel.
Figure 20:
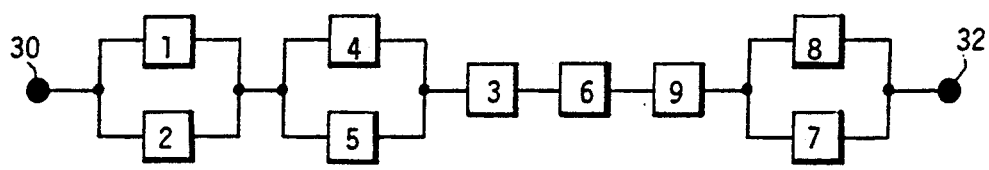
FIG. 20 is a schematic diagram of the series-parallel configuration shown physically in FIGS. 18 and 19.

In FIGS. 18 (front panel) and 19 (back panel) is shown a wiring diagram that corresponds to a typical series-parallel electrical connections depicted schematically in FIG. 20. Several other electrical wiring schemes may be made to suit the particular use of the power pack 40.

Figure 22:
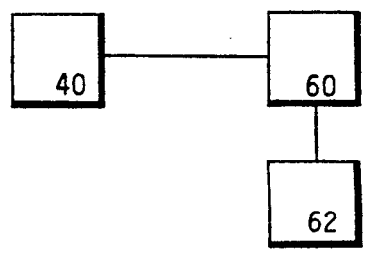
FIG. 22 is a schematic diagram of a switching circuit that controls the voltage and current level outputs of the power pack

To further facilitate the selection of the voltage and current levels desired, a switching circuit, as shown in FIG. 22 may be employed. In the circuit shown, the output of the power pack 40 is applied to a switching circuit 60 that is controlled either manually or electrically by a complimentary control circuit 62.

Figure 23:
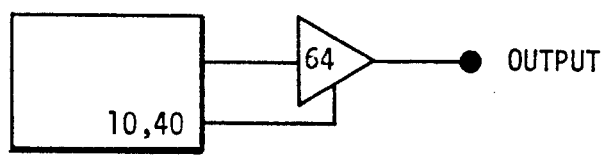
FIG. 23 is a schematic diagram of the power pack's output being amplified by an amplifier where the power pack also supplies the power to operate the amplifier.
Figure 24:
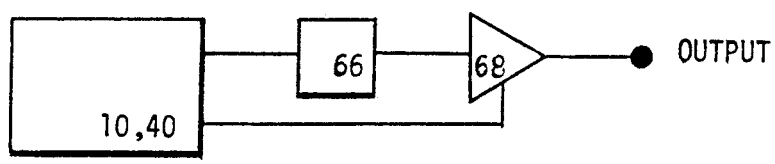
FIG. 24 is a schematic diagram of the power pack's output being applied to an inverter circuit where the output of the inverter is further amplified by an amplifier where the power pack also supplies the power to operate the inverter and the amplifier.

The power pack may be connected to supply a single d-c voltage as shown in FIG. 20. Alternatively, as shown in FIG. 23, the d-c output may be amplified by a d-c amplifier 64 or the d-c output as shown in FIG. 24 may be applied to an inverter 66 where the output is converted to an a-c voltage and further amplified by an a-c amplifier 68. In both of the above cases, the power pack also supplies the power that is required to operate the amplifiers 64,68 and inverter 66.

While the invention has been described in complete detail and pictorially shown in the accompanying drawings, it is not to be limited to such details, since many changes and modifications may be made to the invention without departing from the spirit and the scope thereof. Hence, it is described to cover any and all modifications and forms which may come within the language and scope of the claims.

We claim:

1. A self-sustaining power module comprising:
  a) a photovoltaic cell,
  b) a glass enclosure having a phosphor deposited to its inner surfaces and a tritium gas inserted into and hermetically sealed within said glass enclosure, wherein said glass enclosure functions as a shield against radioactivity and as a self-sustaining photon-generating means that is attached to the receptor surface of said photovoltaic cell where the photons bombard and cause said photovoltaic cell to generate an electrical current flow, and c) means for applying the current from said photovoltaic cell to an external load.

2. A self-sustaining power module comprising:

a) a glass enclosure having a phosphor deposited to its inner surface and a tritium gas inserted into and hermetically sealed within said glass enclosure, wherein said glass enclosure functions as a shield against radioactivity and as a self-sustaining photon-generating means having first and second photon generating surfaces, b) a first photovolatic cell having its receptor surface attached to the first photon generating surface of said self-sustaining photon-generating means, c) a second photovoltaic cell having its receptor surface attached to the second photon generating surface of said self-sustaining photon-generating means, d) an electrical connection between each of said first and second photovoltaic cells culminating in a pair of output electrodes to which an external load is connected.

3. The power module as specified in claims 1 or 2 further comprising a frequency enhancing means laminated between said photovoltaic cell and said self-sustaining photon-generating means.

4. The power module as specified in claims 1 or 2 further comprising a resilient sleeve located around said power module.

* * * * *